(12) United States Patent
Kim et al.

(10) Patent No.: US 10,277,243 B2
(45) Date of Patent: Apr. 30, 2019

(54) SUCCESSIVE APPROXIMATION REGISTER ANALOG-TO-DIGITAL CONVERTER COMBINED WITH FLASH ANALOG-TO-DIGITAL CONVERTER

(71) Applicant: UNIST (Ulsan National Institute of Science and Technology), Ulsan (KR)

(72) Inventors: Jae Joon Kim, Ulsan (KR); Kyeong Hwan Park, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 15/976,708

(22) Filed: May 10, 2018

(65) Prior Publication Data

US 2018/0331690 A1 Nov. 15, 2018

(30) Foreign Application Priority Data

May 11, 2017 (KR) .......................... 10-2017-0058892

(51) Int. Cl.
| | |
|---|---|
| *H03M 1/12* | (2006.01) |
| *H03M 1/46* | (2006.01) |
| *H03M 1/36* | (2006.01) |
| *H03M 7/16* | (2006.01) |
| *H03M 1/14* | (2006.01) |
| *H03M 1/68* | (2006.01) |

(52) U.S. Cl.
CPC .......... *H03M 1/462* (2013.01); *H03M 1/145* (2013.01); *H03M 1/361* (2013.01); *H03M 1/68* (2013.01); *H03M 7/165* (2013.01); *H03M 1/365* (2013.01); *H03M 1/466* (2013.01)

(58) Field of Classification Search
CPC ........ H03M 1/123; H03M 1/56; H03M 1/468; H03M 1/145; H03M 1/361; H03M 1/12; H03M 1/46; H03M 1/00
USPC .......................... 341/155, 156, 161, 162, 172
See application file for complete search history.

(56) References Cited

U.S. PATENT DOCUMENTS

| | | | | |
|---|---|---|---|---|
| 6,828,927 B1 * | 12/2004 | Hurrell | ................. | H03M 1/145 341/156 |
| 7,741,981 B1 * | 6/2010 | Wan | ........................ | H03M 1/02 341/110 |
| 8,760,336 B2 * | 6/2014 | Nam | ....................... | H03M 1/38 341/156 |

(Continued)

FOREIGN PATENT DOCUMENTS

KR 10-1711542 3/2017

*Primary Examiner* — Linh V Nguyen
(74) *Attorney, Agent, or Firm* — Fenwick & West LLP

(57) ABSTRACT

An SAR ADC combined with a flash ADC includes a clock generator, a DAC and a comparator. The SAR ADC combined with the flash ADC further includes an SAR logic unit using a successive approximation register control to determine, while a clock signal is a first state that is either high or low, a part of digital bits of the input signal based on a signal outputted from the comparator and control the DAC to generate a first analog signal based on the first determined digital bits and a flash ADC using a flash control to determine, during a second state switched from the first state, a remaining part of the digital bits of the input signal based on the first analog signal and control the DAC to generate a second analog signal based on the second determined digital bits in the second state.

6 Claims, 5 Drawing Sheets

(56) References Cited

U.S. PATENT DOCUMENTS

| | | | |
|---|---|---|---|
| 8,884,801 B1* | 11/2014 | Ranjbar | H03M 1/145 |
| | | | 341/156 |
| 9,362,939 B1* | 6/2016 | Rath | H03M 1/145 |
| 9,425,814 B1* | 8/2016 | Verma | H03M 7/165 |
| 2013/0106629 A1* | 5/2013 | Nys | H03M 1/144 |
| | | | 341/110 |
| 2013/0321189 A1* | 12/2013 | Yoshioka | H03M 1/38 |
| | | | 341/156 |
| 2014/0266842 A1* | 9/2014 | Thompson | H03M 1/145 |
| | | | 341/155 |
| 2017/0155399 A1* | 6/2017 | Tsai | H03M 1/462 |

\* cited by examiner

US 10,277,243 B2

SUCCESSIVE APPROXIMATION REGISTER ANALOG-TO-DIGITAL CONVERTER COMBINED WITH FLASH ANALOG-TO-DIGITAL CONVERTER

FIELD OF THE INVENTION

The present disclosure relates to a successive approximation register analog-to-digital converter (SAR ADC) combined with a flash analog-to-digital converter (flash ADC); and, more particularly, to an SAR ADC combined with a flash ADC in which the SAR ADC and the flash ADC operate individually for one cycle of a clock signal to convert a plurality of digital bits during one clock cycle.

BACKGROUND OF THE INVENTION

Among ADCs, which sample and digitize an analog signal, SAR type ADCs and flash type ADCs are well known in the art.

The SAR ADC generates digital bits by successively comparing an analog input signal per one clock cycle. The digital bits of the analog input signal can be obtained by comparing the bits in the order from the most significant bit to the least significant bit. However, the SAR ADC can obtain only one bit per one clock cycle as shown in FIG. 1. Therefore, it is difficult to realize a fast operation.

The flash ADC obtains the digital bits of the analog input signal by comparing the analog input signal with various reference levels at one time by using multiple comparators. Since, however, the flash ADC compares the signal with various reference levels in one step, the number of comparators and DACs required for constructing the flash ADC is exponentially increased as the number of digital bits to be obtained in one step is increased. Accordingly, the cost is increased and the size is also increased.

SUMMARY OF THE INVENTION

In view of the above, the present disclosure provides a technique for solving the drawback of the SAR ADC in which only one bit can be obtained during one clock cycle, which makes it difficult to realize a fast operation, and the drawback of the flash ADC in which the number of comparators and resistors are increased exponentially as the number of digital bits to be calculated is increased.

However, the technical objects to be achieved by the embodiment of the present disclosure are not limited to the above-described technical objects, and may include various technical objects within the scope obvious to those skilled in the art from the contents to be described below.

In accordance with an aspect of the present disclosure, there is provided an SAR ADC combined with a flash ADC, including: a clock generator configured to generate a clock signal; a DAC configured to convert digital bits into an analog signal; a comparator, to which an input signal is inputted, configured to output a signal having a higher voltage between the analog signal converted by the DAC and the input signal when the clock signal is a first state that is either high or low; an SAR logic unit configured to use a successive approximation register control to determine, during the first state, a first part of digital bits of the input signal based on the signal outputted from the comparator and control the DAC to generate a first analog signal based on the first determined digital bits; and a flash ADC configured to use a flash control to determine, during a second state that is switched to either high or low from the first state, a second part of the digital bits of the input signal based on the first analog signal and control the DAC to generate a second analog signal based on the second determined digital bits in the second state.

Further, the SAR ADC combined with the flash ADC may determine a 4-bit binary output corresponding to the input signal during one cycle of the clock signal in a way that the SAR logic unit determines one bit of the 4-bit binary output during the first state and the flash ADC, which is a 3-bit flash ADC, determines three bits of the 4-bit binary output by determining a 7 bit thermometer code during the second state.

Further, the comparator may include a capacitor having one end connected to a gate of a transistor that operates to output the signal having the higher voltage and the other end connected to a ground or a power source of the comparator. The capacitor may be connected to the ground during the first state and may be connected to the power source during the second state.

In accordance with another aspect of the present disclosure, there is provided a method for determining digital bits of an input signal by using an SAR ADC combined with a flash ADC, including: allowing a DAC to convert preset digital bits to an analog signal; and allowing a clock generator to generate a clock signal, (a) when the clock signal is a first state that is either high or low, allowing a comparator to output a signal having a higher voltage between the analog signal converted by the DAC and the input signal; allowing an SAR logic unit to determine a first part of digital bits of to the input signal based on the signal outputted from the comparator by using a successive approximation register control; and allowing an SAR logic unit to control the DAC to generate a first analog signal based on the first determined digital bits, (b) when the clock signal is a second state that is switched to either high or low from the first state, allowing the flash ADC to determine a second part of the digital bits of the input signal based on the first analog signal by using a flash control; and allowing the flash ADC to control the DAC to generate a second analog signal based on the second determined digital bit. The steps (a) and (b) may be alternately repeated until all of the digital bits of the input signal are determined.

The SAR logic unit may determine 1 bit of a digital signal corresponding to the input signal during the first state, and the flash ADC may determine 3 bits of the digital signal corresponding to the input signal during the second state, thereby determining 4 bits during one cycle of the clock signal.

Further, the comparator may includes a capacitor having one end connected to a gate of transistor that operates to output the signal having the higher voltage and the other end connected to a ground or a power source of the comparator, and the capacitor may be connected to the ground during the first state and may be connected to the power source during the second state.

In accordance with the aspects of the present disclosure, it is possible to convert a plurality of digital bits during one clock cycle by individually operating the SAR ADC and the flash ADC during one clock cycle, and also to minimize the increase in the number of comparators and the increase in the size even if the number of digital bits to be determined during one clock cycle is increased.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
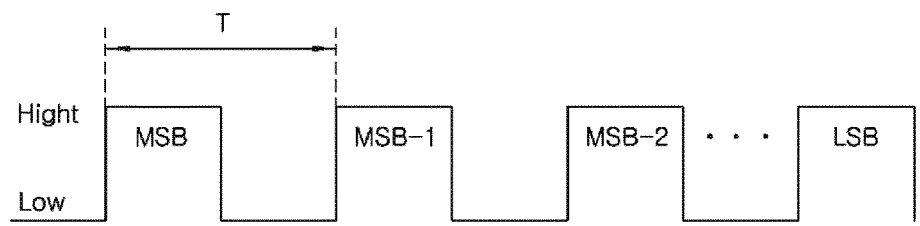
FIG. 1 shows an example in which an SAR ADC calculates one bit during one clock cycle.

Advantages, features and methods for achieving them will become apparent from the embodiments which will be described later in detail with reference to the accompanying drawings. However, the present disclosure is not limited to the embodiments described herein below but may be implemented in many different forms. The embodiments are provided to make complete the present disclosure and to completely inform the scope of the present disclosure to those skilled in the art to which the present disclosure pertains. The present disclosure is defined only by the claims.

In describing the embodiments of the present disclosure, the detailed descriptions of well-known functions or configurations will be omitted if it is determined that the detailed descriptions of well-known functions or configurations may unnecessarily make obscure the spirit of the present disclosure. The terms to be described later are defined in view of the functions exercised in the embodiments of the present disclosure and may vary depending on the intention of a user or an operator and the practice. Thus, the definition of terms shall be made based on the overall contents of the subject specification.

Functional blocks illustrated in the drawings and described below are merely examples of possible implementations. In other implementations, different functional blocks may be used without departing from the scope of the detailed description. Although one or more functional blocks of the present disclosure are illustrated as separate blocks, one or more of the functional blocks of the present disclosure may be combination of various hardware and software elements executing the same function.

Further, it should be understood that an expression that some elements are "included" is an expression of an "open type" and the expression simply denotes that the corresponding elements are present, but does not exclude additional elements.

Furthermore, when one element is described as being "connected" or "coupled" to the other element, it should be understood that one element may be directly connected or coupled to the other element, but a third element may be interposed between the two elements.

The terms used herein, including ordinal numbers such as "first" and "second" may be used to describe, and not to limit, various components. The terms simply distinguish the components from one another.

Hereinafter, embodiments of the present disclosure will be described with reference to the accompanying drawings.

Figure 2:
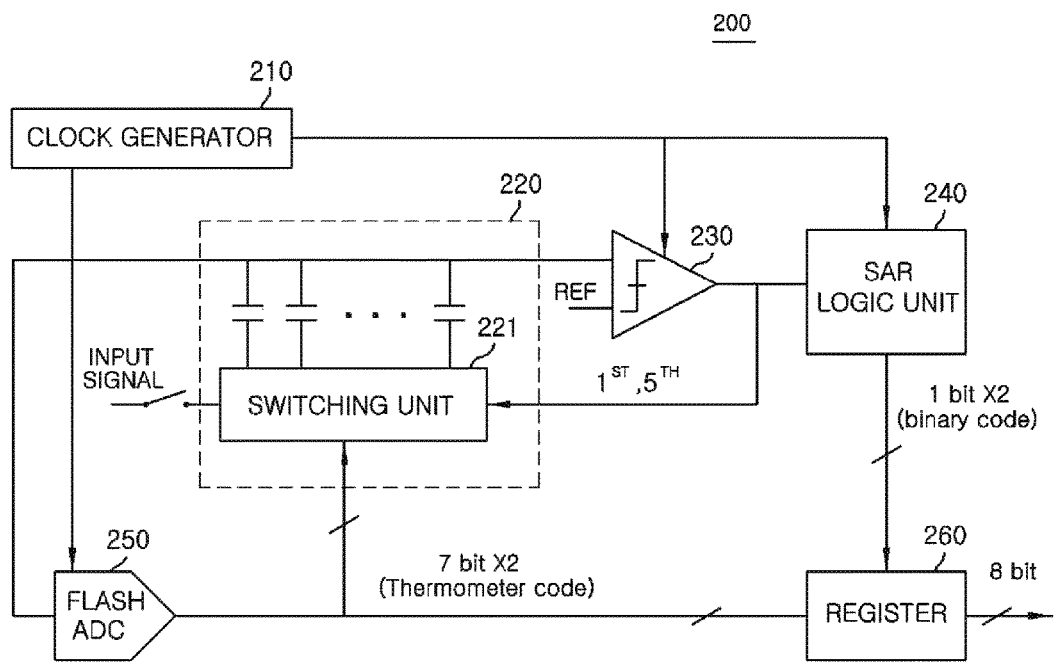
FIG. 2 shows a configuration of an SAR ADC combined with a flash ADC according to one embodiment of the present disclosure.

FIG. 2 shows a configuration of a successive approximation register analog-to-digital converter (SAR ADC) combined with a flash analog-to-digital converter (flash ADC) according to an embodiment of the present disclosure.

As shown in FIG. 2, an SAR ADC 200 combined with a flash ADC according to the embodiment of the present disclosure includes a clock generator 210, a digital-to-analog converter (DAC) 220, a comparator 230, an SAR logic unit (e.g., SAR logic circuit) 240, a flash ADC 250, and a register 260.

The clock generator 210 generates a square wave signal that oscillates periodically between a high state (logic state 1) and a low state (logic state 0). In this specification, "the first state" refers to either the high state or the low state of the clock signal, and "the second state" refers to a state switched from the first state. In other words, when the first state is high, the second state is low, and when the first state is low, the second state is high.

The DAC 220 converts digital bits to an analog signal. For example, the DAC 220 may be same as a DAC employed in a conventional SAR ADC that can generate an analog signal by applying voltages to a plurality of capacitors through a switching unit (e.g., switching circuit) 221 for applying a voltage corresponding to the digital bit to the capacitor. However, this is merely an example, and various types of DACs may be used.

The comparator 230 and the SAR logic unit 240 form a basic configuration for allowing the SAR ADC to determine a digital bit. The comparator 230 is configured to output a signal having a higher voltage between two inputted signals.

The SAR logic unit 240 is configured to use a successive approximation register control to determine a part of the digital bits corresponding to the input signal based on the signal outputted from the comparator 230 and control the switching unit 221 of the DAC 220 to generate an analog signal based on the determined digital bits.

The comparator 230 compares the analog signal converted by the DAC 220 with the analog input signal to be converted to the digital bits. For example, the comparator 230 outputs a signal having a higher voltage between the analog signal converted by the DAC 220 and the input signal. When the signal outputted from the comparator 230 is the input signal, the SAR logic unit 240 determines the most significant bit among undetermined digital bits to 1. When the signal outputted from the comparator 230 is the analog signal converted by the DAC 220, the SAR logic unit 240 determines the most significant bit among undetermined digital bits to 0. However, this process is merely an example for allowing the SAR ADC to determine the digital bits, and various known methods may be used.

The flash ADC 250 obtains the digital bits of the analog input signal by comparing the value of the analog input signal with various reference levels at one time through a plurality of comparators.

As shown in FIG. 1, the conventional SAR ADC determines one digital bit during the first state (high) and does not determine another digital bit during the second state (low) within one clock cycle. On the other hand, in accordance with one embodiment of the present disclosure, it is possible to additionally determine another digital bit of the input signal by using the flash ADC 250 when the first state (high)

in which the SAR ADC operates is switched to the second state (low) during one clock cycle.

Figure 3:
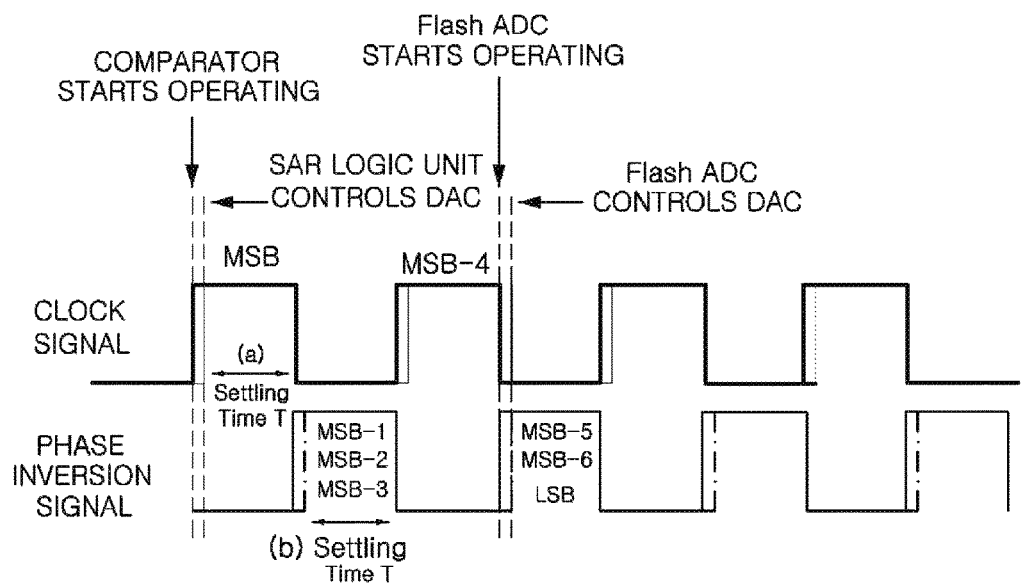
FIG. 3 shows an example in which the SAR ADC combined with the flash ADC according to one embodiment of the present disclosure calculates a plurality of digital bits during one clock cycle.

FIG. 3 shows an example in which the SAR ADC 200 combined with the flash ADC according to the embodiment of the present disclosure calculates a plurality of digital bits during one clock cycle. In FIG. 3, an upper signal is a clock signal generated by the clock generator 210 and a lower signal is a phase inversion signal in which the phase of the clock signal is inverted for convenience of explanation. Here, the clock signal may be a signal for operating the comparator and the SAR logic unit, and the phase inversion signal may be a signal for operating the flash ADC.

As shown in FIG. 3, when the clock signal is the first state (high in FIG. 3), the comparator 230 operates to output a signal having a higher voltage between the analog signal converted by the DAC 220 and the input signal.

Then, the SAR logic unit 240 operates to determine a part of the digital bits corresponding to the input signal by the SAR control based on the signal outputted from the comparator 230 and control the switching unit 221 of the DAC 220 to generate an analog signal based on the determined digital bits. At this time, a period of time required until the analog signal corresponding to the voltage is generated in the capacitor of the DAC 220 by the switching unit 221 is referred to as "settling time T".

Accordingly, in the first state, the comparator 230 and the SAR logic unit 240 determine the digital bits of the input signal according to the SAR control.

When the clock signal is switched from the first state to the second state, the flash ADC 250 operates to determine a remaining part of the digital bits corresponding to the input signal by the flash control based on the analog signal, which is converted by the DAC 220 based on the digital bits determined by the SAR logic unit 240 in the first state. Further, the flash ADC 250 controls the switching unit 221 of the DAC 220 to generate another analog signal based on the determined digital bits.

Here, the flash ADC 250 determines the digital bits in the form of a thermometer code. Thus, when n-bit binary output is desired to be obtained, the thermometer code of $2^n-1$ bits is determined. Accordingly, if the flash ADC 250 is a 3-bit flash ADC 250, seven digital bits are determined in the second state.

Therefore, if the number of binary bits that can be obtained by the SAR logic unit 240 during one clock cycle is 'one' and the number of binary bits that can be obtained by the flash ADC 250 during one clock cycle is 'n', the number of capacitors constituting the DAC 220 can be an integer multiple of '$(1)+(2^n-1)=2^n$'.

Figure 4:
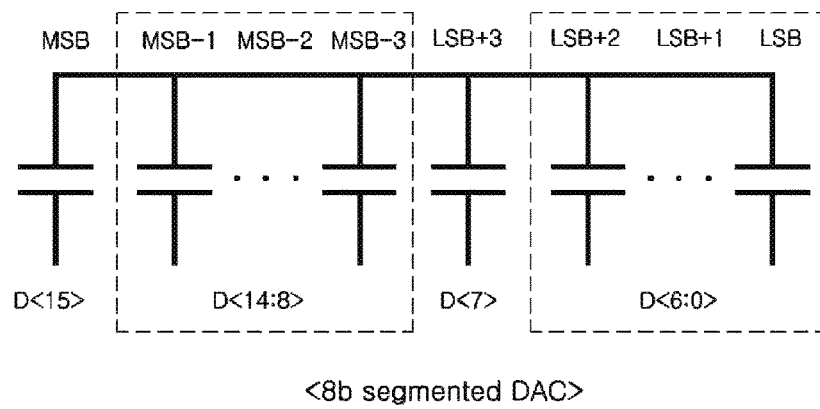
FIG. 4 shows an example of a DAC according to one embodiment of the present disclosure.

FIG. 4 shows an example of the DAC 220 according to one embodiment of the present disclosure. Referring to FIG. 4, the DAC 220 includes 16 capacitors in order to obtain 8 binary bits. Here, if the number of binary bits that can be obtained by the SAR logic unit 240 during one clock cycle is one and the number of binary bits that can be obtained by the flash ADC 250 during one clock cycle is three, the SAR logic unit 240 determines one digital bit (D<15>) and the flash ADC 250 determines seven digital bits (D<14:8>) during one clock cycle according to one embodiment of the present disclosure. Accordingly, the binary bits of MSB, MSB-1, MSB-2, and MSB-3 can be obtained. Thereafter, in a next clock cycle, the SAR logic unit 240 determines one digital bit (D<7>) and the flash ADC 250 determines seven digital bits (D<6:0>). Accordingly, binary bits of LSB+3, LSB+2, LSB can be obtained.

Therefore, the DAC 220 may include at least eight $(1+(2^3-1)=8)$ capacitors in order to receive one digital bit determined by the SAR logic part 240 and seven digital bits determined by the flash ADC 250 during the one clock cycle. Alternatively, the DAC 220 may include capacitors whose number is an integer multiple of 8. Accordingly, a larger number of bits can be obtained as the clock cycle is repeated. However, the above-described flash ADC 250 is merely an example, and the type of the flash ADC 250 is not limited thereto. Therefore, in accordance with the embodiment of the present disclosure, a plurality of digital bits can be obtained during one clock cycle.

The register is configured to store the digital bits of the input signal which are determined by the SAR logic unit 240 and the flash ADC 250.

Figure 5:
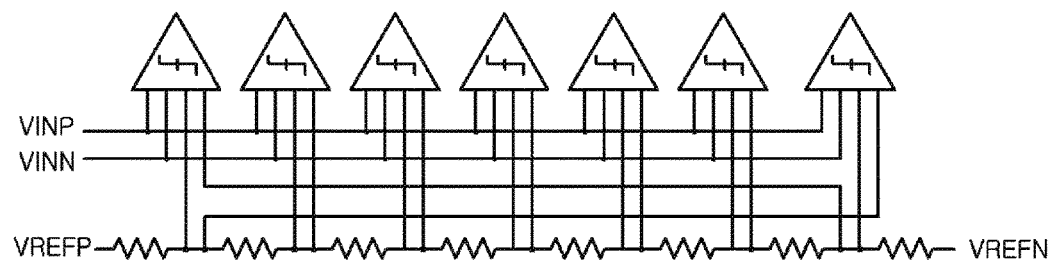
FIG. 5 shows an example of a flash ADC according to one embodiment of the present disclosure.

FIG. 5 shows an example of the flash ADC 250 according to one embodiment of the present disclosure. In FIG. 5, a circuit configuration of a 3-bit flash ADC 250 is illustrated as an example of the flash ADC 250. In this case, seven $(2^3-1)$ comparators 230 are required to obtain 3-bit binary output simultaneously.

Here, if 4-bit binary output is desired to be obtained simultaneously by the flash ADC 250, 15 $(2^4-1)$ comparators 230 are required. Accordingly, in order to increase the number of binary bits that can be obtained by the flash ADC 250 during one clock cycle, the number of comparators 230 and the number of DACs 220 are increased exponentially. Accordingly, the cost is increased and the size is considerably increased.

In accordance with the embodiment of the present disclosure, by combining the SAR ADC with the flash ADC 250, it is possible to additionally determine 1 binary bit during one clock cycle simply by adding one comparator 230. Therefore, it is more efficient in terms of the number of comparators 230 compared to the conventional flash ADC 250, and the increase in circuit size is relatively small.

Referring back to FIG. 3, in the case of using the SAR ADC together with the flash ADC 250, the operation speed of the SAR ADC is relatively slower than that of the flash ADC 250. Therefore, an error may occur when the settling time T is not sufficiently ensured in the first state.

Figure 6:
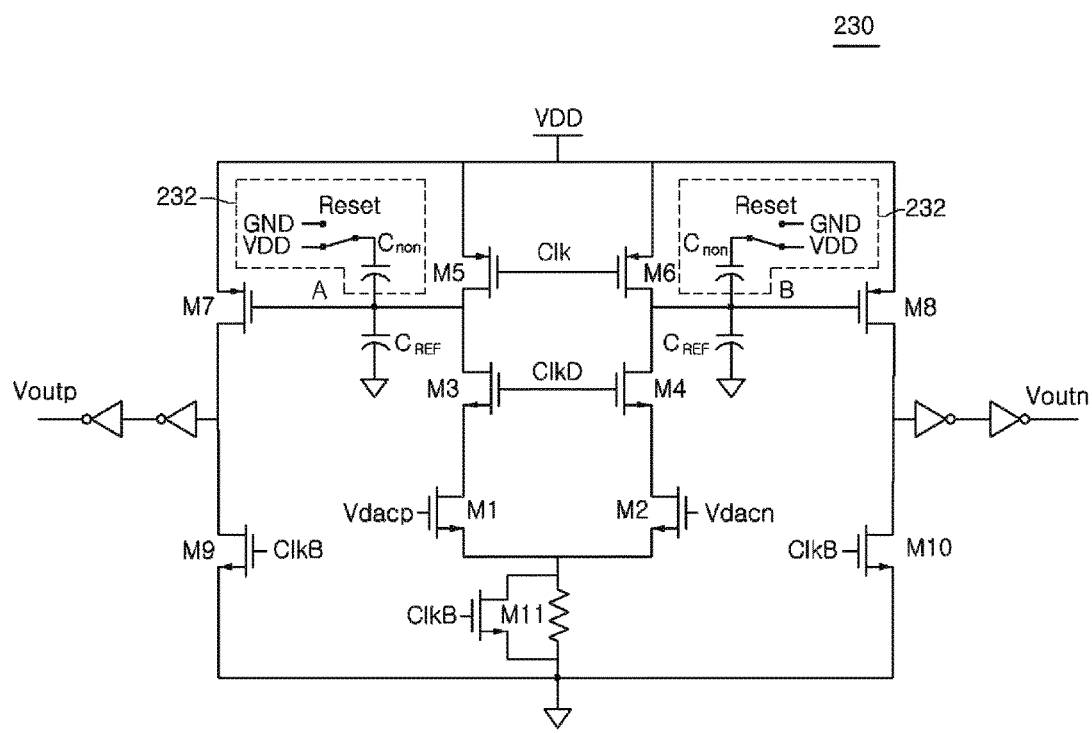
FIG. 6 shows an example of a comparator according to one embodiment of the present disclosure.

In other words, the bottleneck of the SAR ADC 200 combined with the flash ADC according to one embodiment of the present disclosure occurs at the settling time T that is a period of time in which the SAR logic unit 240 controls the DAC 220. Accordingly, it is significant to ensure sufficient settling time T by increasing the operation speed of the comparator 230. FIG. 6 shows an example of the comparator 230 according to one embodiment of the present disclosure.

Referring to FIG. 6, the comparator 230 according to one embodiment of the present disclosure further includes a circuit configuration 232 shown in FIG. 6, compared to the conventional comparator. More specifically, the comparator 230 according to one embodiment of the present disclosure further includes a capacitor Cnon having one end connected to each of gates of transistors M7 and M8 that operate to output a signal having a higher voltage and the other end connected to a ground GND or a power source VDD of the comparator 230. Here, the capacitor Cnon is connected to the ground GND during the first state and is connected to the power source VDD during the second state.

Accordingly, in the second state in which the flash ADC 250 operates, the voltage of the power source VDD is applied to both ends of the capacitor Cnon and, thus, there are no electric charges. In the first state in which the comparator 230 starts to operate, the other end of the capacitor (Cnon) is connected to the ground (GND) and, thus, the voltages of Nodes A and B are lowered instantaneously. Thus, the transistors M7 and M8 operate faster than those in the conventional comparator 230, which makes it possible to ensure sufficient settling time T.

Figure 7:
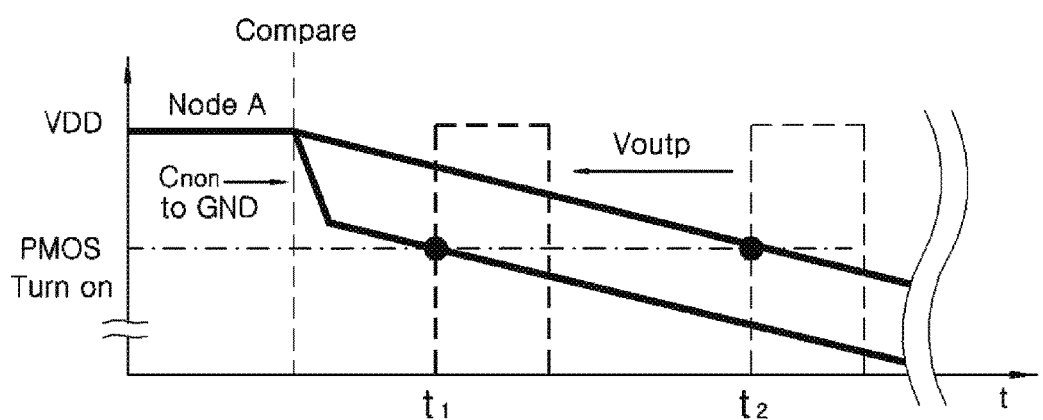
FIG. 7 shows an example how an output time of the comparator is reduced according to one embodiment of the present disclosure.

FIG. 7 shows an example how the output time of the comparator 230 is reduced according to one embodiment of the present disclosure. Referring to FIG. 7, the conventional comparator outputs the result at time t2 because the voltages applied to the gates of the transistors M7 and M8 are gradually decreased as the clock signal for operating the comparator is generated at time 'Compare' shown in FIG. 7). On the other hand, in the comparator 230 according to one embodiment of the present disclosure, the other end of the capacitor Cnon where there are no charges is connected to the ground GND (Cnon to GND) and the voltages of Nodes A and B are instantaneously lowered. Therefore, the result can be outputted at time t1 earlier than the time t2.

The SAR logic unit 240 and the flash ADC 250 of the above-described embodiment can be realized by an operation device including a memory having commands programmed to execute the functions thereof, and a microprocessor for executing those commands.

Figure 8:
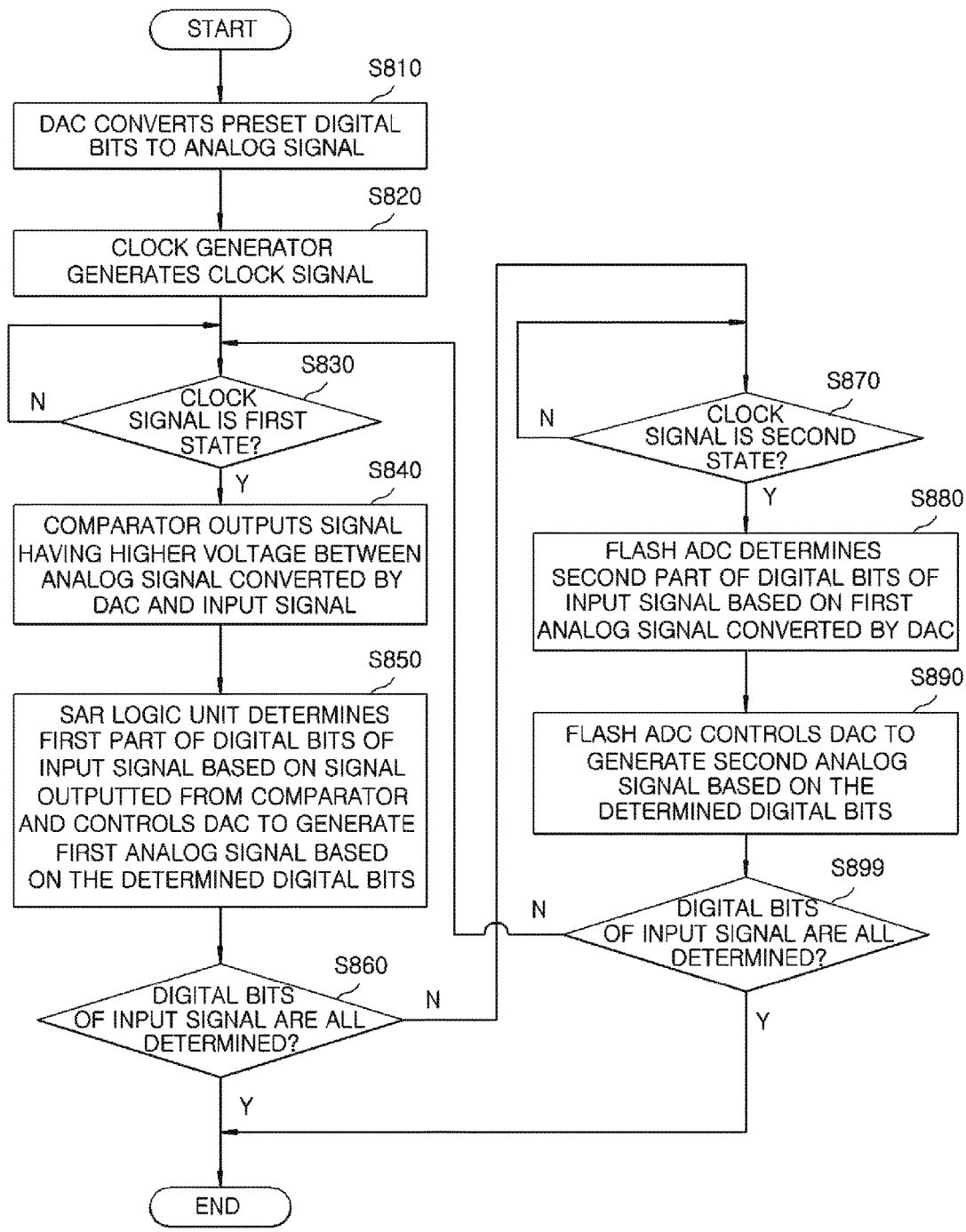
FIG. 8 is a flowchart showing the processes of a method for determining digital bits of an input signal by using the SAR ADC combined with the flash ADC according to one embodiment of the present disclosure.

FIG. 8 is a flowchart showing the processes of a method for determining digital bits of an input signal by using the SAR ADC 200 combined with the flash ADC according to one embodiment of the present disclosure. The respective steps of the method shown in FIG. 8 can be executed by the SAR ADC 200 combined with the flash ADC which has been described with reference to FIG. 2. The respective steps will be described hereinafter.

First, the DAC 220 converts preset digital bits to an analog signal (S810).

Next, the clock generator 210 generates a clock signal (S820). When the clock signal is the first state (S830), the comparator 230 outputs a signal having a higher voltage between the analog signal converted by the DAC 220 and the input signal (S840). Then, the SAR logic unit 240 operates to determine a first part of the digital bits corresponding to the input signal by using the SAR control based on the signal outputted from the comparator 230 and controls the DAC 220 to generate a first analog signal based on the determined digital bits (S850).

Thereafter, the processor determines whether or not all of the digital bits of the input signal stored in the register have been determined (S860). If all of the digital bits have been determined, the processing is completed. On the contrary, if only a part of the digital bits has been determined, the flash ADC 250 operates, when the clock signal is the second state (S870), to determine a second part of the digital bits corresponding to the input signal by using the flash control based on the first analog signal converted by the DAC 220 (S880). Next, the flash ADC 250 controls the DAC 220 to generate a second analog signal based on the determined digital bits (S890). Thereafter, the processor determines whether or not all of the digital bits of the input signal stored in the register have been determined (S899). If all of the digital bits have been determined, the processing is completed. On the contrary, if all of the digital bits have not been determined, the step S830 and the subsequent steps are executed again.

The steps S830 to S860 and the steps S870 to S899 are executed within one clock cycle and may be alternately repeated until all of the digital bits corresponding to the input signal are determined.

Therefore, in accordance with the above-described embodiment, it is possible to convert a plurality of digital bits during one clock cycle by individually operating the SAR ADC and the flash ADC 250 during one clock cycle, and also possible to minimize the increase in the size even if the number of digital bits to be calculated during one clock cycle is increased.

The above-described embodiments of the present disclosure can be implemented by various devices. For example, the embodiments of the present disclosure can be implemented by hardware, firmware, software, combinations thereof, or the like.

In the case of implementation using hardware, the method according to the embodiments of the present disclosure may be implemented by one or more devices, such as application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors and the like.

In the case of implementation using firmware or software, the method according to the embodiments of the present disclosure may be implemented in the form of modules, procedures or functions for performing the above-described functions or operations. A computer program in which a software code or the like is recorded may be stored in a computer-readable storage medium or a memory unit and executed by a processor. The memory unit may be provided inside or outside the processor to exchange data with the processor by various known devices.

As described above, those skilled in the art will understand that the present disclosure can be implemented in other forms without changing the technical idea or essential features thereof. Therefore, it should be understood that the above-described embodiments are merely examples, and are not intended to limit the present disclosure. The scope of the present disclosure is defined by the accompanying claims rather than the detailed description, and the meaning and scope of the claims and all changes and modifications derived from the equivalents thereof should be interpreted as being included in the scope of the present disclosure.

While the disclosure has been shown and described with respect to the embodiments, it will be understood by those skilled in the art that various changes and modifications may be made without departing from the scope of the disclosure as defined in the following claims.

What is claimed is:

1. An successive approximation register analog-to-digital converter (SAR ADC) combined with a flash analog-to-digital converter (ADC), comprising:
a clock generator configured to generate a clock signal;
a digital-to-analog converter (DAC) configured to convert digital bits into an analog signal;
a comparator, to which an input signal is inputted, configured to output a signal having a higher voltage between the analog signal converted by the DAC and the input signal when the clock signal is a first state that is either high or low;
an SAR logic unit configured to use a successive approximation register control to determine, during the first state, a first part of digital bits of the input signal based on the signal outputted from the comparator and control the DAC to generate a first analog signal based on the first determined digital bits; and
a flash ADC configured to use a flash control to determine, during a second state that is switched to either high or low from the first state, a second part of the digital bits of the input signal based on the first analog signal and control the DAC to generate a second analog signal based on the second determined digital bits in the second state.

2. The SAR ADC combined with the flash ADC of claim 1, wherein the SAR ADC combined with the flash ADC determines a 4-bit binary output corresponding to the input signal during one cycle of the clock signal in a way that the SAR logic unit determines one bit of the 4-bit binary output during the first state and the flash ADC, which is a 3-bit flash ADC, determines three bits of the 4-bit binary output by determining a 7 bit thermometer code during the second state.

3. The SAR ADC combined with the flash ADC of claim 1, wherein the comparator includes:
   a capacitor having one end connected to a gate of a transistor that operates to output the signal having the higher voltage and the other end connected to a ground or a power source of the comparator,
   wherein the capacitor is connected to the ground during the first state and is connected to the power source during the second state.

4. A method for determining digital bits of an input signal by using an successive approximation register analog-to-digital converter (SAR ADC) combined with a flash analog-to-digital converter (ADC), comprising:
   allowing a digital-to-analog converter (DAC) to convert preset digital bits to an analog signal; and
   allowing a clock generator to generate a clock signal,
   (a) when the clock signal is a first state that is either high or low,
   allowing a comparator to output a signal having a higher voltage between the analog signal converted by the DAC and the input signal;
   allowing an SAR logic unit to determine a first part of digital bits of to the input signal based on the signal outputted from the comparator by using a successive approximation register control; and
   allowing an SAR logic unit to control the DAC to generate a first analog signal based on the first determined digital bits,
   (b) when the clock signal is a second state that is switched to either high or low from the first state,
   allowing the flash ADC to determine a second part of the digital bits of the input signal based on the first analog signal by using a flash control; and
   allowing the flash ADC to control the DAC to generate a second analog signal based on the second determined digital bit,
   wherein the steps (a) and (b) are alternately repeated until all of the digital bits of the input signal are determined.

5. The method of claim 4, wherein the SAR logic unit determines 1 bit of a digital signal corresponding to the input signal during the first state, and the flash ADC determines 3 bits of the digital signal corresponding to the input signal during the second state, thereby determining 4 bits during one cycle of the clock signal.

6. The method of claim 4, wherein the comparator includes:
   a capacitor having one end connected to a gate of transistor that operates to output the signal having the higher voltage and the other end connected to a ground or a power source of the comparator,
   wherein the capacitor is connected to the ground during the first state and is connected to the power source during the second state.

* * * * *